United States Patent
Southivong

(10) Patent No.: US 7,834,785 B2
(45) Date of Patent: Nov. 16, 2010

(54) CABAC TYPE ENCODING DEVICE AND METHOD

(75) Inventor: Tchi Southivong, Saint-Gratien (FR)

(73) Assignee: Assistance Technique et Etude de Materiels Electroniques - ATEME, Bievres (FR)

( * ) Notice: Subject to any disclaimer, the term of this patent is extended or adjusted under 35 U.S.C. 154(b) by 0 days.

(21) Appl. No.: 12/306,556

(22) PCT Filed: Jun. 27, 2007

(86) PCT No.: PCT/FR2007/051543

§ 371 (c)(1),
(2), (4) Date: Jun. 3, 2009

(87) PCT Pub. No.: WO2008/001012

PCT Pub. Date: Jan. 3, 2008

(65) Prior Publication Data
US 2009/0322573 A1    Dec. 31, 2009

(30) Foreign Application Priority Data
Jun. 28, 2006  (FR) .................................. 06 05818

(51) Int. Cl.
*H03M 7/00* (2006.01)

(52) U.S. Cl. ........................ 341/107; 708/233; 712/218
(58) Field of Classification Search ................. 341/107; 708/233; 712/218
See application file for complete search history.

(56) References Cited

U.S. PATENT DOCUMENTS

| | | | | |
|---|---|---|---|---|
| 6,952,764 B2* | 10/2005 | Sager et al. | .................. | 712/218 |
| 7,183,951 B2* | 2/2007 | Bossen | ...................... | 341/107 |
| 2005/0010623 A1* | 1/2005 | Ku | .............................. | 708/233 |

* cited by examiner

*Primary Examiner*—Jean B Jeanglaude
(74) *Attorney, Agent, or Firm*—Young & Thompson

(57) ABSTRACT

An encoding device and method, of CABAC type, for an initial stream of binary digital information intended to generate an outgoing stream to form video images, after decoding, the method included the following steps: bit-by-bit analysis of the successive series of bits of the initial binary stream so as to deduce therefrom, for each bit, an interval representing the probability of occurrence associated with this bit, this interval being defined by its size CIR and its lower bound CIL, analysis of this interval so as to ensure, if necessary, a renormalization thereof. The renormalization is non-iterative and for each bit of the initial stream is compliant with the appended figure in which: M is the length of the sequence S of high-order bits common to CIL and CIR, N is the integer number such that $CIR.2^{N-1} < 0.25 \leq CIR.2^N$, BO is the number of bits waiting to be inserted.

2 Claims, 2 Drawing Sheets

CABAC TYPE ENCODING DEVICE AND METHOD

CROSS-REFERENCE TO RELATED APPLICATIONS

Figure 1:
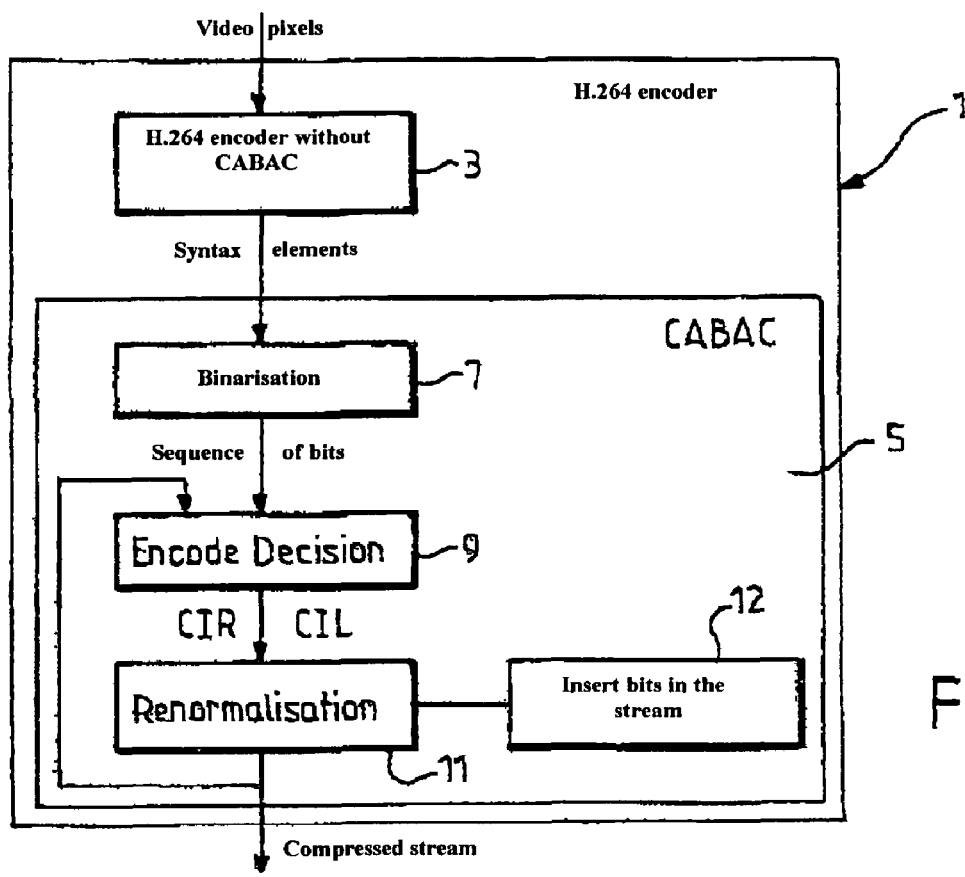

This application is a National Stage application of PCT/FR2007/051543 filed Jun. 27, 2007, which claims priority to French application FR 0605818, filed Jun. 28, 2006.

BACKGROUND OF THE INVENTION

This invention relates to a CABAC (Context Adaptive Binary Arithmetic Coding) type method of encoding an initial stream of binary digital information intended to generate an output stream to form video images after decoding.

DESCRIPTION OF THE RELATED ART

It is known that the syntax and methods used to decode a stream of video information are defined in the so-called ITU H.264 or ISO/IEC 14496 MPEG-4 Part. 10 video compression standard. For information, this standard describes methods of producing compressed information streams.

Encoding devices that generate streams conforming with this standard comprise an encoding stage, the task of which is to generate a binary stream that is representative of the information to be transmitted. This encoding stage can use two methods, called the CAVLC (Context Adaptive Variable Length Coding) and CABAC. The CABAC method is more attractive in that it generates a binary stream with a lower throughput than the former, to the detriment of greater complexity.

It is known that the CABAC method comprises a so-called "renormalisation" step. This step uses an iterative method that forms a sort of "bottleneck" in the method, because it is inherently relatively slow due to its long execution time. This step involves a probability of occurrence interval associated with one bit, and threshold variables that will be denoted by $V_{1/4}$ and $V_{1/2}$ in the following. $V_{1/4}$ is equal to 0.25 in decimal mode. In the remainder of the text, we might also write "01000 . . ." in binary mode (the total number of bits depending on the required precision for encoding of the interval). Similarly $V_{1/2}$ that is equal to 0.5 in decimal mode, can be written "1000 . . ." in binary mode.

SUMMARY OF THE INVENTION

The purpose of this invention is to disclose an encoding device and method in which the iterative method according to prior art is replaced by a method that accesses the same results directly, starting from the same input parameters.

Another purpose of this invention is a CABAC type encoding device for encoding an initial binary stream of digital information that will generate an output stream to form video images after decoding comprising:

analysis means capable of analysing successive series of bits in the initial binary stream bit by bit, and for each bit deducing an interval representing the probability of occurrence associated with this bit, this interval being defined by its size CIR and its lower limit CIL, means of storing the number of bits BO waiting for insertion after processing the bit preceding the current bit in the initial binary stream, means of renormalisation, used to determine whether renormalisation is necessary for the bit in progress and to perform this renormalisation, characterised in that said renormalisation means are not iterative and include:

a) a first module to calculate the upper limit of the interval CIH equal to CIL+CIR−1, b) a second module to determine the sequence S of high order bits common to CIL and CIH, the length of this sequence being denoted M, c) a third module to determine an integer number N such that $CIR.2^{N-1} < V_{1/4} \leq CIR.2^{N}$, d) a fourth module to calculate the minimum P between M and N and if P is not zero, to insert the P high order bits of the sequence S and the BO bits in waiting into the output stream, and to set BO to 0, e) a fifth module to update the number BO of unknown bits that are waiting for insertion for renormalisation of the next bit of the initial binary stream, by increasing BO by N−M, f) a sixth module to calculate the value of CIR for the next bit of the initial binary stream equal to the value of CIR for the current bit multiplied by $2^N$, g) a seventh module to calculate the value of CIL for the next bit of the initial binary stream, equal to the value of CIL for the current bit multiplied by $2^N$ and if M is not equal to N, to subtract $V_{1/2}$ from it.

Preferably, the renormalisation means are contained in an ASIC (Application Specific Integrated Circuit) or an in situ FPGA (Field Programmable Gate Array) type component, or in the form of software in a data processor.

The device according to the invention is capable of performing renormalisation processing that only requires a few simple calculations without any iteration. It is thus much faster than the device according to prior art.

Another purpose of the invention is a CABAC type encoding method, to encode an initial stream of binary digital information intended to generate an output stream to form video images after decoding in which:

successive series of bits in the initial binary stream are analysed bit by bit and for each bit, an interval is deduced representing the probability of occurrence associated with this bit, this interval being defined by its size CIR and its lower limit CIL, this interval is analysed and is renormalized if necessary, the renormalisation particularly taking account of a number BO of bits waiting for insertion resulting from processing of the previous bit in the initial binary stream, characterised in that renormalisation is not iterative and comprises steps that:

a) calculate the upper limit of the interval CIH equal to CIL+CIR−1, b) determine the sequence S of high order bits common to CIL and CIH, the length of this sequence being denoted M, c) determine the integer number N such that $CIR.2^{N-1} < V_{1/4} \leq CIR.2^{N}$, d) calculate the minimum P between M and N and then, if P is not zero, insert the P high order bits from the sequence S and the BO bits in waiting into the output stream after processing of the previous bit into the initial binary stream, and set the number BO to 0, and e) update the number BO of unknown bits that are waiting for insertion for renormalisation of the next bit of the initial binary stream, by increasing BO by N−M, f) calculate the new value of CIR for renormalisation of the next bit of the initial binary stream, by multiplying it by $2^N$, g) calculate the new value of CIL for renormalisation of the next bit of the initial binary stream by multiplying it by $2^N$, and if M is not equal to N, subtracting $V_{1/2}$ from the new value of CIL, and h) continue renormalisation by applying the above steps for the next bit in the sequence of bits.

BRIEF DESCRIPTION OF THE DRAWING FIGURES

Figure 2:
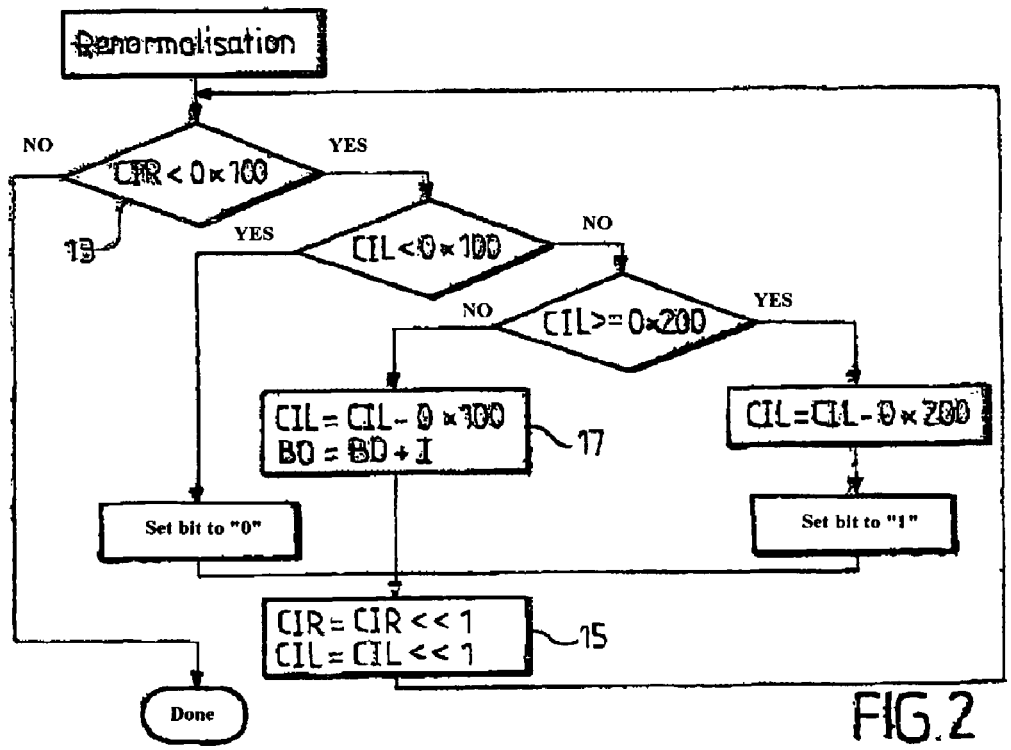
Figure 3:
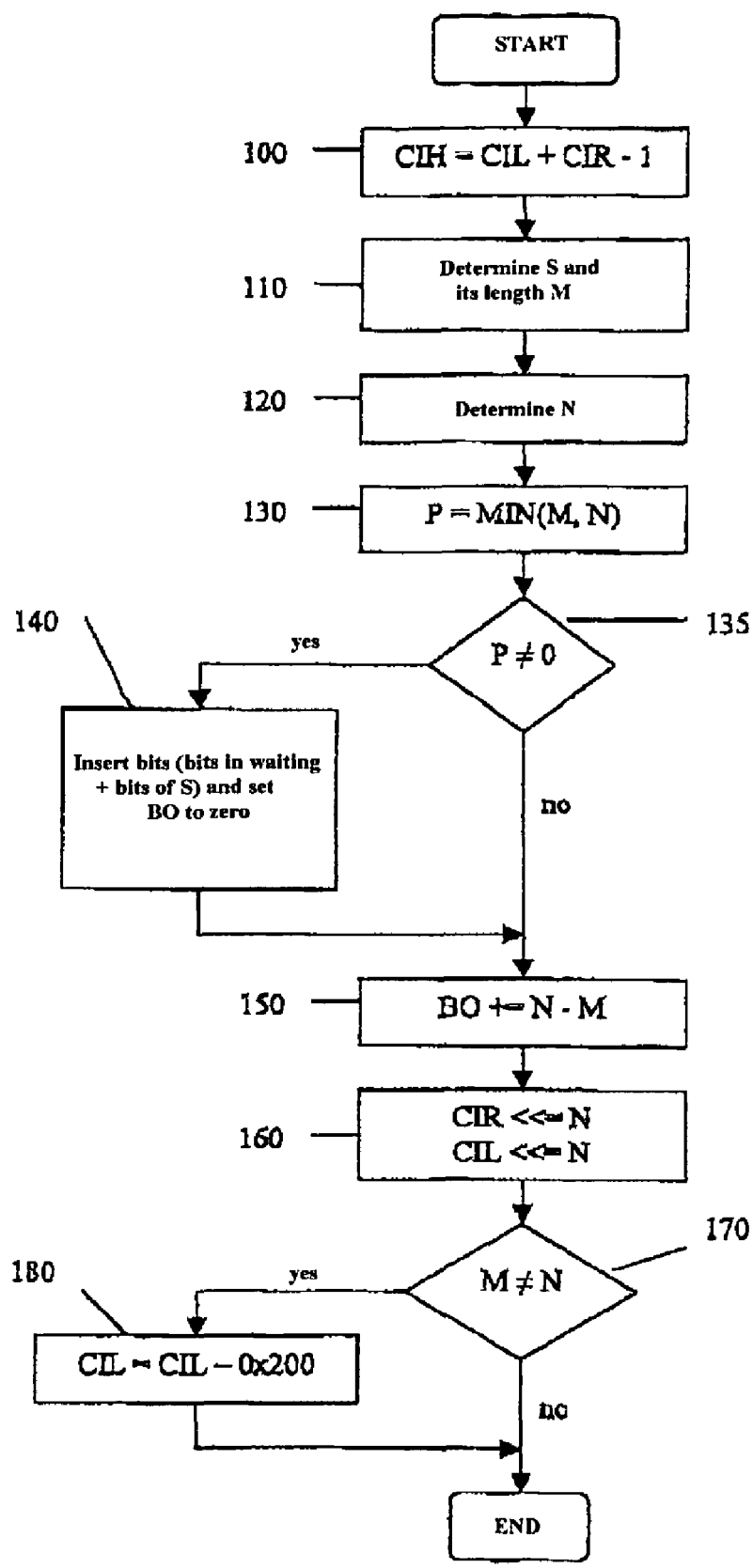

The following describes a CABAC type encoder and more particularly the renormalisation step, with reference to the appended drawings in which:

FIG. 1 is a schematic representation of an encoder according to standard H.264 showing the different modules used to execute the steps in the CABAC method, FIG. 2 is a schematic representation of the different steps in the renormalisation phase according to prior art, and FIG. 3 is a schematic representation of the different steps in the renormalisation phase according to the invention.

DETAILED DESCRIPTION OF THE INVENTION

As shown in FIG. 1, the encoder 1 conforming with standard H.264 comprises encoder means 3 that, on reception of video pixels, provide output data called syntax elements that are sent to encoding means conforming with the CABAC method. For simplification reasons, these means 5 will be called "CABAC" in the following.

The CABAC 5 thus has binary means 7 that transform syntax elements into bit sequences. The binarization means 7 are followed by means 9 called "EncodeDecision" in standard H.264 that analyse these bit sequences bit by bit so as to deduce an interval from it that is representative of the probability of occurrence associated with the bit considered. This interval is characterised by two parameters, namely firstly its size called "CodIRange" in said standard and hereinafter referred to as CIR, and secondly its lower limit called "CodILow" in said standard and hereinafter referred to as CIL.

The EncodeDecision means 9 are related to the renormalisation means 11 that implement the previously mentioned renormalisation function. This function analyses the interval associated with each bit in said bit sequence and decides whether or not it should be scaled, in other words renormalized. When it is found that renormalisation is not necessary, this step is short circuited.

The renormalisation means 11 cooperate with insertion means 12 that, if renormalisation is done, have the role of inserting one or several bits in the compressed encoder output stream.

As a reminder, FIG. 2 shows the different steps in the renormalisation phase implemented by the renormalisation means 11 according to prior art, in other words in which an iterative method is used to determine the bits to be inserted in the stream.

In a first step of this phase, the value of CIR is tested (block 13) to determine if its size is less than $V_{1/4}$ (the binary value of $V_{1/4}$ on 10 bits is 01 0000 0000). If this is not the case, renormalisation is not done and this step is short circuited for the bit considered.

If the value of CIR is less than $V_{1/4}$, rescaling must be done (renormalized), and it is then multiplied (block 15) by 2 successively, as long as it remains less than $V_{1/4}$. These are the successive iterations that are responsible for the long execution time. As can be seen in the figure, the value of CIL is also tested and the values of CIL and BO (number of unknown bits waiting for insertion as defined in standard H.264) are updated, during every iteration.

This invention aims at replacing the entire iterative method by direct processing. The invention is based on use of a property of arithmetic encoding. This encoding specifies that during encoding of a message (sequence of bits to be transmitted), the size of the interval defining the probability of occurrence of a message bit reduces. This means that at any encoding instant, high order bits (in binary mode) or the first decimals (in decimal mode) of the lower limit of the interval that are identical to those at the upper limit are definitively fixed and will remain constant until the end of encoding.

Consider an example to illustrate this principle. Suppose that the final interval defining a message is as follows, expressed in decimal mode:

[0.1234567; 0.1234568[

Assume that the interval during encoding is equal to:

[0.1234023; 0.1235871[

The first decimals "0.123" of the lower limit are identical to the first decimals of the upper limit. Theory tells us that in this case we can predict that they will remain constant until the end of encoding, which is actually the case seeing the values of the final interval.

Transposition of this property in the context of renormalizing the CABAC is particularly useful because we can use it to predict the results of this method directly, starting from the characteristics of the interval.

FIG. 3 diagrammatically shows an embodiment of the renormalisation method according to the invention.

This method uses the size of the CIR and the lower limit CIL of the interval defining the probability of occurrence associated with the current bit to be processed, as input data.

A first step 100 calculates the upper limit CIH of the interval. It is simply equal to the sum of CIL and CIR minus 1 (in binary mode).

A second step 110 determines the sequence S that corresponds to the sequence of high order bits of CIL and CIH that are identical, and the length M (number of bits) in this sequence S. This operation can be done simply by applying the "EXCLUSIVE OR" (XOR) operator to the CIL, CIH pair and counting the number of consecutive "0" high order bits in the result to obtain M. In practice, there is no need to define a particular variable S. All that is necessary is to memorise the number M of identical high order bits in CIL and CIH. S is then simply the sequence of M high order bits of CIL or CIH.

The next step 120 then determines the number of iterations N that would be necessary in the renormalisation method according to prior art. This number N is equal to the number of multiplications by two or (which is equivalent) shifts the bits of CIR to the left (block 15, FIG. 2) so that the CIR becomes greater than $V_{1/4}$.

In practice, there is no need to perform an iterative calculation to determine the value of N. It is known that N can be obtained directly from the equation:

$$N = lmbd(1, CIR) - lmbd(1, V_{1/4})$$

where "lmbd(a,b)" is a function frequently used in particular on digital signal processors (DSP) that supplies the number of the leftmost bit (the highest order bit) for which the value is equal to a in the binary number b, and "1" is a bit with the value one.

Refer to document US2005/0001745 and particularly paragraphs [0026] to [0028], about use of the above equation to calculate N. However, note that in this document, the fact that N is calculated without any iteration does not eliminate the iterative method according to prior art, which on the contrary is considered as being necessary to determine bits to be inserted (see [0030] in the document mentioned).

It will be noted that steps 110 and 120 in the method according to the invention are independent and can therefore be executed in arbitrary order or in parallel.

The next step 130 calculates the minimum P between M and N. If P is not zero (test 135), the insertion step 140 is performed to insert the P high order bits of S and the BO bits in waiting into the output stream, and to set BO equal to 0. This step 140 is known and defined in standard H.264. It consists of inserting the high order bit of S (or the high order bit of CIL or CIH which is equivalent) into the output stream, followed by BO bits equal to the value inverse to the value of the high order bit of S, then inserts the remaining P−1 bits of S.

The next step 150 in the renormalisation method consists of calculating the number BO of unknown bits (defined in standard H.264 and updated by block 17 in the method according to prior art described with reference to FIG. 2) that are in waiting for insertion for the next renormalisation. This number is increased by the difference N−M. The new values for CIR and CIL are then calculated. There are obtained in a step 160 by multiplying CIR and CIL by $2^N$ (in other words in practice shifting the bits of CIR and CIL towards the left N times), and if M is not equal to N (test 170) by subtracting $V_{1/2}$ from the value of CIL (step 180).

Each step reference 100 to 180 in FIG. 3 corresponds to one of the modules or a part of the module in this encoding device, for the encoding device according to the invention.

For example, the appendix contains one embodiment of the renormalisation step shown in FIG. 3. It is expressed in the form of a software implementation in the C language. Variables have a range of 32 bits. In this example, the _norm( ) function is a specific instruction that counts the number of identical consecutive high order bits of the argument passed to it.

In this example, the numbers "21", "0x3ff" and "0x200" are related to the number of CIL and CIR bits in the standard.

Thus, "21" is derived from _norm(10 0000 0000) that is the number of high order bits in 10-bit variables. This is used to count the number of high order bits equal to 0, considering only the 10 significant bits of the two variables.

The value "0x3ff" is a mask with 10 bits equal to "1" to avoid overflows in the other bits and "0x200" is the value $V_{1/2}$ encoded on 10 bits.

APPENDIX

RENORMALISATION

```
//-----------------------------------
// input:  CIL (resolution 10 bits according to the standard)
//         CIR (resolution 9 bits according to the standard)
//         BO
    int N, M, P, CIH;
    N = _norm(CIR) − _norm (V_1/4);
    CIH = CIL + CIR − 1;
    M = _norm (CIL ^ CIH) −21;
    P = min (M, N);
    If (P!=0)
        // send P high order bits of CIL and BO bits in waiting, and
reset BO to 0
        BO = 0
    BO + = N − M;
    CIL − (CIL << N) & 0x3ff;
    if (M ! = N) CIL −= 0x200;
    CIR <<= N;
//-----------------------------------
```

The invention claimed is:

1. CABAC type encoding device, for encoding an initial binary stream of digital information to generate an output stream to form video images after decoding comprising:

analysis means capable of analysing successive series of bits in the initial binary stream bit by bit, and for each bit deducing an interval representing the probability of occurrence associated with this bit, this interval being defined by its size CIR and its lower limit CIL, means of storing a number of bits BO waiting for insertion after processing the previous bit in the initial binary stream, means of renormalisation used to determine whether renormalisation is necessary for the current bit and to perform this renormalisation, characterised in that said renormalisation means are not iterative and include:

a) a first module to calculate the upper limit of the interval CIH equal to CIL+CIR−1, b) a second module to determine the sequence S of high order bits common to CIL and CIH, the length of this sequence being denoted M, c) a third module to determine an integer number N such that $CIR.2^{N-1} < V_{1/4} \leq CIR.2^N$, where $V_{1/4}$ is equal to 0.25 in decimal mode, d) a fourth module to calculate the minimum P between M and N and if P is not zero, to insert the P high order bits of the sequence S and the BO bits in waiting into the output stream, and to set BO to 0, e) a fifth module to update the number BO of unknown bits that are waiting for insertion for renormalisation of the next bit of the initial binary stream, by increasing BO by N−M, f) a sixth module to calculate the value of CIR for the next bit of the initial binary stream equal to the value of CIR for the current bit multiplied by $2^N$, g) a seventh module to calculate the value of CIL for the next bit of the initial binary stream, equal to the value of CIL for the current bit multiplied by $2^N$ and if M is not equal to N, to subtract $V_{1/2}$ from it, where $V_{1/2}$ is equal to 0.5 in decimal mode.

2. CABAC type encoding method, for encoding an initial stream of binary digital information to generate an output stream to form video images after decoding in which:

successive series of bits in the initial binary stream are analysed, bit by bit, and for each bit an interval representing the probability of occurrence associated with this bit is deduced, this interval being defined by its size CIR and its lower limit CIL, this interval is analysed, and is renormalized if necessary, the renormalisation particularly taking account of a number BO of bits waiting for insertion resulting from processing of the previous bit in the initial binary stream, characterised in that renormalisation is not iterative and comprises steps that:

a) calculate the upper limit of the interval CIH equal to CIL+CIR−1, b) determine the sequence S of high order bits common to CIL and CIH, the length of this sequence being denoted M, c) determine the integer number N such that $CIR.2^{N-1} < V_{1/4} \leq CIR.2^N$, where $V_{1/4}$ is equal to 0.25 in decimal mode, d) calculate the minimum P between M and N and then, if P is not zero, insert the P high order bits from the sequence S and the BO bits in waiting into the output stream after processing of the previous bit into the initial binary stream, and set the number BO to 0, and e) update the number BO of unknown bits that are waiting for insertion for renormalisation of the next bit of the initial binary stream, by increasing BO by N−M, f) calculate the new value of CIR for renormalisation of the next bit of the initial binary stream, by multiplying it by $2^N$, g) calculate the new value of CIL for renormalisation of the next bit of the initial binary stream by multiplying it by $2^N$, and if M is not equal to N, subtracting $V_{1/2}$ from the new value of CIL, where $V_{1/2}$ is equal to 0.5 in decimal mode, and h) continue renormalisation by applying the above steps for the next bit in the sequence of bits.

* * * * *